United States Patent
Pilz

(10) Patent No.: US 10,126,358 B2
(45) Date of Patent: Nov. 13, 2018

(54) METHOD FOR FAULT DETECTION OF AN ELECTRICAL CIRCUIT, AND AN ELECTRICAL CIRCUIT

(71) Applicant: Endress+Hauser Conducta GmbH+Co. KG, Gerlingen (DE)

(72) Inventor: Stefan Pilz, Geithain (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 14 days.

(21) Appl. No.: 15/635,469

(22) Filed: Jun. 28, 2017

(65) Prior Publication Data
US 2018/0003766 A1 Jan. 4, 2018

(30) Foreign Application Priority Data
Jul. 4, 2016 (DE) .................. 10 2016 112 201

(51) Int. Cl.
*G01R 31/28* (2006.01)
(52) U.S. Cl.
CPC ................ *G01R 31/2889* (2013.01)
(58) Field of Classification Search
CPC ..................................................... G01R 31/025
See application file for complete search history.

(56) References Cited

U.S. PATENT DOCUMENTS

| | | | | |
|---|---|---|---|---|
| 6,313,641 B1 * | 11/2001 | Brooks | ............... | G01R 31/025 324/424 |
| 2011/0084705 A1 * | 4/2011 | Kawamura | ......... | G01R 27/025 324/551 |

FOREIGN PATENT DOCUMENTS

| | | |
|---|---|---|
| DE | 2922498 A1 | 1/1980 |
| DE | 3812633 C2 | 10/1989 |
| EP | 0844945 B1 | 6/1998 |
| WO | 2015049510 A1 | 4/2015 |

OTHER PUBLICATIONS

Search Report for German Patent Application No. 10 2016 112 201.7, German Patent Office, dated Apr. 28, 2017, 2015, 7 pp.

\* cited by examiner

*Primary Examiner* — Noam Reisner
(74) *Attorney, Agent, or Firm* — Mark A. Logan; PatServe

(57) ABSTRACT

The present disclosure relates to a method and a corresponding circuit for the fault detection of an electrical circuit, wherein the electrical circuit includes a first inductive interface, at least a first branch, and a second branch, wherein the first and the second branches are connected in parallel, wherein the first branch includes two parallel and counter-currently-connected diodes, and wherein the first and second branches are connected to the first inductive interface. The method includes applying an alternating voltage or an alternating current across the first inductive interface via a second inductive interface, wherein the applied voltage or current is low enough that essentially no current flows through either the first or the second diode; measuring the impedance across the first inductive interface via the second inductive interface; and determining whether a fault is present in the second branch.

9 Claims, 1 Drawing Sheet

METHOD FOR FAULT DETECTION OF AN ELECTRICAL CIRCUIT, AND AN ELECTRICAL CIRCUIT

CROSS-REFERENCE TO RELATED APPLICATION

The present application is related to and claims the priority benefit of German Patent Application No. 10 2016 112 201.7, filed on Jul. 4, 2016, the entire contents of which are incorporated herein by reference.

TECHNICAL FIELD

The present disclosure relates to a method for the fault detection of an electrical circuit, as well as an electrical circuit.

BACKGROUND

Typically, a cable for connection to a sensor is connected to a transmitter. The connection of cable to sensor is frequently accomplished via plug connection, e.g., by galvanically decoupled interfaces, inductive interfaces. Thus, electrical signals can be transmitted contactlessly. Advantages with regard to corrosion protection, electrical isolation, prevention of mechanical wear of the plug, etc., are features of this galvanic isolation. The applicant distributes such systems under the name "Memosens."

The inductive interfaces in question are usually implemented as a system having two coils that are plugged into each other, e.g., via the plug connection in question. Typically, both data (in both directions) as well as energy (from connection side to sensor side) are transmitted.

The sensors are in some cases exposed to harsh environmental conditions, such that subsequent sensors can also become defective. The analysis of defective sensors or head assemblies has proven here to be difficult. By measurement of the current consumption and evaluation of the communication, the error can often be located only inexactly or not at all. In most cases, an increased current consumption is measurable in connection with no or poor communication. In order to detect errors, the sensor must then often be opened. The resulting fault profiles are diverse.

SUMMARY

The object of the present disclosure is to find faults of sensors or the associated electrical circuit without having to open the sensor.

The object is achieved by a method for an electrical circuit, wherein the electrical circuit includes a first inductive interface, at least a first branch and a second branch, wherein the first and the second branches are connected in parallel, wherein the first branch includes two parallel and counter-currently-connected diodes, and wherein the first and second branches are connected to the first inductive interface, and wherein the method includes the following steps: application of an alternating voltage or an alternating current across the first inductive interface via a second inductive interface, wherein the alternating voltage or alternating current are selected to be low enough that essentially no current flows through either the first or the second diode; measurement of the impedance across the first inductive interface via the second inductive interface; and determination of whether a fault is present in the second branch based upon the measured impedance.

The measurement of the impedance across the first interface in this context is intended to mean that the impedance of the overall electrical circuit starting from the second inductive interface is measured. This measurement then includes the two inductive interfaces and the two branches.

However, if the alternating voltage and the alternating current is reduced so that the two diodes do not conduct, the impedance measurement is limited to a few components that can then be evaluated, viz., first inductive interface, the components in the second branch, conductor paths, and inter-layer connections. Conductor paths and inter-layer connections are usually insignificant in this context. Although the diodes are operated in the breakthrough or blocking range, such a minimal voltage is present that only a diffusion current or leakage current is flowing. There the components in the first branch are "hidden" behind the diodes and are not detected by the impedance measurement.

In an embodiment, the measured impedance is compared to a target impedance, and a determination of the type of fault is made based upon the deviation.

A lower value of the ohmic portion of the measured impedance as compared to the target impedance indicates a fault due to moisture on or in the circuit.

A lower value of the inductive and/or ohmic portion of the measured impedance as compared to the target impedance thus indicates a fault, an interwinding fault of the first inductive interface.

The object is further achieved by a method for operating an electrical circuit, wherein the electrical circuit includes a first inductive interface, at least a first branch, a second branch, and a voltage-limiting impedance, wherein the voltage-limiting impedance includes a breakthrough range, wherein the first and the second branches are connected in parallel, wherein the first branch includes two parallel and counter-currently-connected diodes, and wherein the first and second branches are connected to the first inductive interface, and wherein the method includes the following steps: application of an alternating voltage or an alternating current across the first inductive interface via a second inductive interface, wherein the alternating voltage or alternating current are selected to be high enough that the voltage-limiting impedance reaches the breakthrough range; measurement of the impedance across the first inductive interface via the second inductive interface; and determination, based upon the measured impedance, of whether a fault of the voltage-limiting impedance is present.

In an embodiment, the measured impedance is compared to a target impedance, and a determination of the type of fault is made based upon the deviation.

An impedance measured as greater than the target impedance indicates the non-presence of one or more components or conductor paths, or a fault across the voltage-limiting impedance.

The object is further achieved by an electrical circuit including: a first side, including: a first inductive interface, at least one first branch and one second branch, wherein the first and the second branches are connected in parallel, wherein the first branch includes two diodes connected in parallel and counter-currently, and wherein the first and second branches are connected to the first inductive interface; a second side, including: a second inductive interface and an impedance-measuring unit connected thereto, wherein the impedance-measuring unit applies an alternating voltage or an alternating current across the second inductive interface, wherein the alternating voltage or the alternating current are selected to be small enough that, when the second inductive interface is connected to the first, essentially no current flows either through the first or the second diode, wherein the impedance-measuring unit measures the impedance across the first inductive interface by means of the second inductive interface and determines whether a fault is present in the second branch of the first side based upon the measured impedance.

The impedance-measuring unit includes a microcontroller.

BRIEF DESCRIPTION OF THE DRAWINGS

The present disclosure is explained in more detail with reference to the following figures. These show.

DETAILED DESCRIPTION

Figure 1:
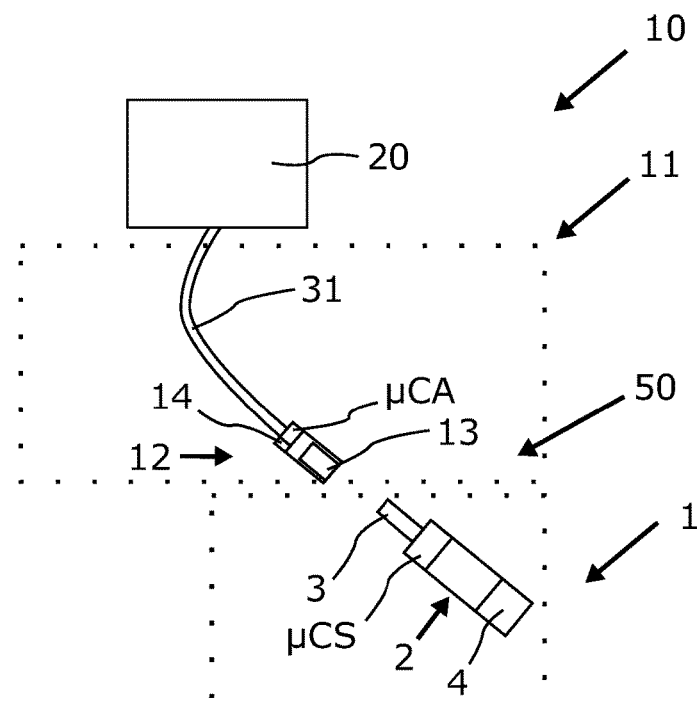
FIG. 1 shows a sensor assembly having an electrical circuit according to the present disclosure in an overall view.

In the figures, the same features are marked with the same reference characters.

As shown in FIG. 1, a circuit 50 according to the present disclosure is used in a sensor assembly 10. Sensor assembly 10 includes a sensor 1 and a connection element 11, which will be discussed first. A sensor 1 communicates with a higher-level unit 20 via a first interface 3. In the example, a transmitter is connected. The transmitter is in turn connected to a control system (not depicted). In one embodiment, sensor 1 communicates directly with a control system. A cable 31 is connected on the sensor side to transmitter 20, and its other end includes a second interface 13 that is complementary to first interface 3. A connection element 11 includes cable 31 along with second interface 13. Interfaces 3, 13 are designed to be electrically isolated, inductive interfaces. Interfaces 3, 13 may be coupled to each other via a mechanical plug connection. The mechanical plug connection is hermetically sealed, so that no fluid, such as the medium to be measured, air, or dust can penetrate.

Data (bi-directional) and power (uni-directional, i.e., from connection element 11 to sensor 1) are transmitted or transferred via the interfaces 3, 13. Sensor assembly 10 is applied predominantly in the process automation.

Sensor 1 includes at least one sensor element 4 for the detection of a measured quantity of the process automation. Sensor 1 is then, for example, a pH sensor also as ISFET generally an ion-selective sensor, a sensor for the measurement of the redox potential from the absorption of electromagnetic waves in the medium, e.g., with wavelengths in the UV-, IR-, and/or visible range, of the oxygen, of the conductivity, of the turbidity, of the concentration of nonmetallic materials, or of the temperature, along with the measured quantity corresponding to each. Sensor 1 is on the first side for the purposes of this present disclosure.

Sensor 1 further includes a first coupling body 2, which includes first interface 3. As previously mentioned, first interface 3 is designed for the transmission of a value that is a function of the measured quantity to the second interface 13. Sensor 1 includes a data processing unit μCS, such as a microcontroller, that processes the values of the measured quantity, such as converting them into a different data format. In this way, an averaging, pre-processing, and digital conversion can be accomplished by the data processing unit μCS.

Sensor 1 can be connected via interfaces 3, 13 to connection element 11, and ultimately to a higher-level unit 20.

As mentioned previously, higher-level unit 20 is, for example, a transmitter or a control center. Data processing unit μCS converts the value that depends upon the measured quantity (that is, the measured signal of sensor element 4) into a protocol that is understandable to the transmitter or the control center. Examples of this include, for example, the proprietary Memosens protocol, or else HART, wirelessHART, Modbus, Profibus Fieldbus, WLAN, ZigBee, Bluetooth, or RFID. This translation can also be done in a separate communications unit instead of in the data processing unit, wherein the communication unit is arranged on the side of sensor 1 or connection element 11. The aforementioned protocols also include wireless protocols, so that a corresponding communications unit includes a wireless module. First and second interfaces 3, 13 are thus designed for bi-directional communication between sensor 1 and higher-level unit 20. As mentioned, first and second interfaces 3, 13 also ensure the supply of power to sensor 1 along with the communication.

Connection element 11 includes second interface 13, wherein second interface 13 is formed in a manner complementary to first interface 3. Connection element 11 likewise includes a data processing unit μCA. Data processing unit μCA may also serve as a repeater for the transmitted signal. Furthermore, data processing unit μCA can also convert or modify the protocol. For example, data can be transmitted in a proprietary protocol from sensor 1 to connection element 11, while the data processing unit μCA of connection element 11 converts this proprietary protocol into a bus protocol. Connection element 11 includes a modulator 14 that modulates the data to its output. Modulator 14 may be designed, for example, as a load modulator. Alternatively, data processing unit μCA can also modulate the data. The data are transmitted via amplitude shift keying. Connection element 11 is on the second side for the purposes of this present disclosure.

Connection element 11 further includes a second, cylindrical coupling body 12 that is designed to be complementary to first coupling body 2 and can be slipped onto a sleeve-like end section on first coupling body 2, wherein second interface 13 is plugged into first interface 3. An opposite arrangement, in which second interface 13 has a sleeve-like design and first interface 3 a plug-like design, is possible without any inventive effort.

A frequent cause of malfunction is moisture. Moisture impairs the operation of the sensor electronics, and can also result in interwinding faults on one of the sensor coils in interfaces 3, 13.

Figure 2:
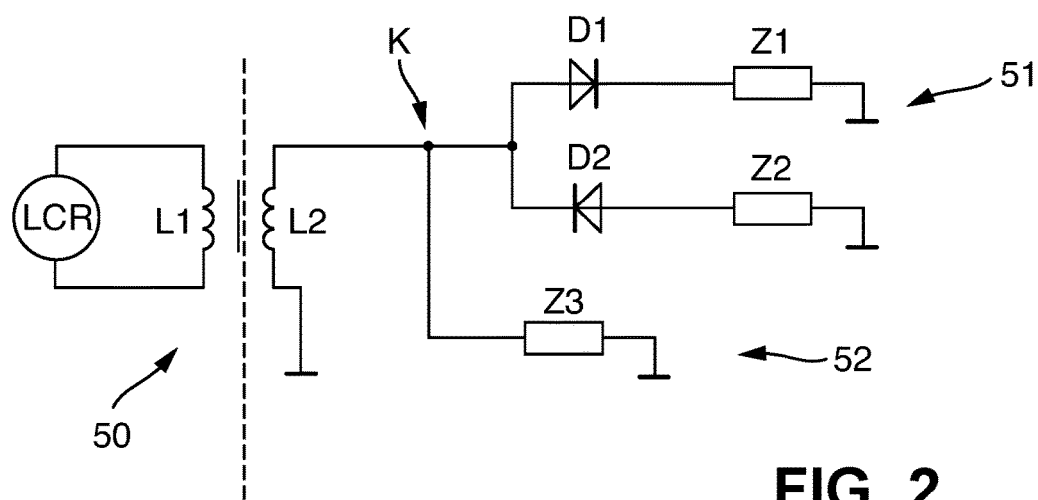
FIG. 2 shows the electrical circuit according to the present disclosure in an overall view.

FIG. 2 shows connection element 11 replaced by an impedance-measuring unit LCR (e.g., an LCR meter), to which first interface 3 is connected, and first interface 3 is connected to sensor 1, it then becomes possible to measure the impedance of the first interface 3 and sensor 1 system. If an alternating voltage or current is set for the output of impedance-measuring unit LCR that corresponds to the typical alternating voltages in operation on first interface 3, the operating impedance of sensor 1 can be measured.

Electrical circuit 50 as shown in FIG. 2 includes at least a first branch 51 and a second branch 52. The first and second branches 51, 52 are connected in parallel, wherein first branch 51 includes two diodes D1, D2 connected in parallel and counter-currently, and wherein first and second branches 51, 52 are connected to first inductive interface 3. The circuit includes additional components, which are generally termed here as impedances Z1, Z2, and Z3.

In a first variant of the method according to the present disclosure, the aforementioned applied alternating voltage or current is reduced to such a degree that the two diodes D1, D2 can no longer conduct. When the diodes D1, D2 are not conducting, the impedance measurement is limited to a few components that can then be evaluated, viz., first interface 3, modulation resistance Z3, and conductor paths as well as inter-layer connections. Other components primarily, impedances Z1 and Z2 which are in the signal curve behind diodes D1 and D2, are "hidden" as a result.

If it is determined in the impedance measurement that the inductive and ohmic portions of the impedance are sharply lowered, this relates to an interwinding fault of the primary interface 3. If the inductive portion is in the target range, but the ohmic portion is reduced, it can generally be assumed that there is moisture on the electrical circuit 50.

The monitoring range for the moisture can be expanded through suitable design of the power supplies, i.e., the conductor paths. In this case, node K as an intersection point of the two branches 51 and 52. The node K can be placed anywhere on the circuit board (not depicted) on which the electrical circuit 50 is located. Therefore, the node K can be placed at critical points, i.e., at points where moisture potentially occurs, or the conductor paths to the components are laid out in such a way that the node K is, accordingly, at the correct location.

One or more of the impedances Z1, Z2, and Z3 described generally above may also include one or more voltage-limiting (individual) impedances. Each voltage-limiting impedance may include a breakthrough range. The voltage-limiting impedances may be incorporated, for example, to satisfy the requirements of the Ex protection.

In another variant, the alternating voltage or alternating current are selected to be high enough that the voltage-limiting impedance reaches the breakthrough range. Then, the impedance is measured as described above. Based upon this impedance, it is possible to determine a fault of the voltage-limiting impedance. An impedance measured as greater than the target impedance indicates, then, the non-presence of or a fault across the voltage-limiting impedance.

What is claimed is:

1. A method for fault detection of an electrical circuit, comprising:
   providing the electrical circuit including a first inductive interface, a first branch including two parallel and counter-currently connected diodes, and a second branch, wherein the first and the second branches are connected in parallel and are connected to the first inductive interface;
   applying an alternating voltage or an alternating current across the first inductive interface via a second inductive interface, wherein the applied voltage or current is small enough that essentially no current flows through the two diodes;
   measuring the impedance across the first inductive interface via the second inductive interface; and
   determining whether a fault is present in the second branch based upon the measured impedance.

2. The method of claim 1, further comprising:
   calculating a deviation between the measured impedance and a target impedance; and
   determining a type of fault based upon the deviation.

3. The method of claim 2, wherein a lower value of an ohmic portion of the measured impedance as compared to the target impedance indicates a fault due to moisture on or in the circuit.

4. The method of claim 2, wherein a lower value of an inductive and/or an ohmic portion of the measured impedance as compared to the target impedance indicates an interwinding fault of the first inductive interface.

5. A method for fault detection of an electrical circuit, comprising:
   providing the electrical circuit including a first inductive interface, a first branch including two parallel and counter-currently connected diodes, a second branch, and a voltage-limiting impedance, wherein the voltage-limiting impedance includes a breakthrough range, and wherein the first and the second branches are connected in parallel and are connected to the first inductive interface;
   applying an alternating voltage or an alternating current across the first inductive interface via a second inductive interface, wherein the applied voltage or current is high enough that the voltage-limiting impedance reaches the breakthrough range;
   measuring the impedance across the first inductive interface via the second inductive interface; and
   determining whether a fault of the voltage-limiting impedance is present based upon the measured impedance.

6. The method of claim 5, further comprising:
   calculating a deviation between the measured impedance and a target impedance; and
   determining a type of fault based upon the deviation.

7. The method of claim 6, wherein the measured impedance being greater than the target impedance indicates the non-presence of the voltage-limiting impedance or a fault across the voltage-limiting impedance.

8. An electrical circuit, comprising:
   a first side including a first inductive interface and a first branch and a second branch, the first branch including two parallel and counter-currently connected diodes, wherein the first branch and the second branch are connected in parallel and are connected to the first inductive interface; and
   a second side, including a second inductive interface and an impedance-measuring unit connected thereto, wherein the impedance-measuring unit is configured to apply an alternating voltage or an alternating current across the second inductive interface,
   wherein the applied voltage or current is small enough that when the second inductive interface is connected to the first inductive interface essentially no current flows through the two diodes,
   wherein the impedance-measuring unit is configured to measure the impedance across the first inductive interface and to determine whether a fault is present in the second branch of the first side based upon the measured impedance.

9. The electrical circuit of claim 8, wherein the impedance-measuring unit includes a microcontroller.

* * * * *